US008537938B2

(12) United States Patent
Lei et al.

(10) Patent No.: US 8,537,938 B2
(45) Date of Patent: Sep. 17, 2013

(54) METHOD AND APPARATUS FOR DEMULTIPLEXER DESIGN FOR MULTI-EDGE TYPE LDPC CODED MODULATION

(75) Inventors: Jing Lei, New Brunswick, NJ (US); Wen Gao, West Windsor, NJ (US)

(73) Assignee: Thomson Licensing, Issy les Moulineaux (FR)

( * ) Notice: Subject to any disclaimer, the term of this patent is extended or adjusted under 35 U.S.C. 154(b) by 324 days.

(21) Appl. No.: 13/138,089

(22) PCT Filed: Jan. 14, 2010

(86) PCT No.: PCT/US2010/000084
§ 371 (c)(1),
(2), (4) Date: Jul. 5, 2011

(87) PCT Pub. No.: WO2010/083038
PCT Pub. Date: Jul. 22, 2010

(65) Prior Publication Data
US 2011/0276860 A1    Nov. 10, 2011

Related U.S. Application Data

(60) Provisional application No. 61/205,021, filed on Jan. 14, 2009.

(51) Int. Cl.
*H03M 13/00* (2006.01)
(52) U.S. Cl.
USPC .......................................... 375/341; 714/758
(58) Field of Classification Search
USPC ................. 375/341, 340, 298; 714/794, 758, 714/755
See application file for complete search history.

(56) References Cited

U.S. PATENT DOCUMENTS

| 2002/0023247 | A1 | 2/2002 | Akiyama et al. |
| 2003/0156659 | A1 | 8/2003 | Hanaoka et al. |
| 2005/0180332 | A1 | 8/2005 | Kim et al. |
| 2007/0033484 | A1* | 2/2007 | Kim et al. ............... 714/758 |
| 2008/0239940 | A1 | 10/2008 | Ye et al. |

FOREIGN PATENT DOCUMENTS

| KR | 1020080106703 | 12/2008 |
| MX | 9710065 | 3/1998 |
| WO | WO2008130165 | 10/2008 |

OTHER PUBLICATIONS

Franceschini et al., "Does the Performance of LDPC Codes Depend on the Channel?", IEEE Transactions on Communications, vol. 54, No. 12, Dec. 2006, pp. 2129-2132.
Peng et al., "Surrogate-Channel Design of Universal LDPC Codes", IEEE Communications Letters, vol. 10, No. 6, Jun. 2006, pp. 480-482.
Pishro-Nik et al., "Results on Non-Uniform Error Correction Using Low-Density Parity-Check Codes", Globecom 2003, San Francisco, CA, Dec. 1-5, 2003, pp. 2041-2045.
Search Report Dated July 5, 2010.

* cited by examiner

*Primary Examiner* — Kevin Kim
(74) *Attorney, Agent, or Firm* — Robert D. Shedd; Ronald J. Kolczynski (57) ABSTRACT

A method involves receiving an LDPC coded bitstream and demultiplexing the received LDPC coded bitstream using an optimized demultiplexer, the optimized demultiplexer being designed by:
  substituting Q levels of a constellation mapper by Q parallel binary erasure channels;
  optimizing a density evolution of erasure probability over said binary erasure channels for a plurality of demultiplexer offsets; and
  identifying from the plurality of demultiplexer offsets those with a minimum number of check node decoder collisions.

10 Claims, 5 Drawing Sheets

METHOD AND APPARATUS FOR DEMULTIPLEXER DESIGN FOR MULTI-EDGE TYPE LDPC CODED MODULATION

CROSS-REFERENCE TO RELATED APPLICATIONS

This application claims the benefit, under 35 U.S.C. §365 of International Application PCT/US2010/000084, filed Jan. 14, 2010, which was published in accordance with PCT Article 21(2) on Jul. 22, 2010 in English and which claims the benefit of U.S. provisional patent application No. 61/205,021, filed Jan. 14, 2009.

TECHNICAL FIELD

The present principles relate to cable transmission systems and techniques. More particularly, it relates to a Forward Error Correction (FEC) header design for cable television transmissions.

BACKGROUND OF THE INVENTION

Turbo codes and LPPC codes represent the leading edge of contemporary channel coding theory and practice. As a hybrid of turbo and LDPC codes, accumulator-based irregular LDPC codes (IRA) with quasi-cyclic structure have been widely adopted in communication standards including IEEE 802.11n, IEEE 802.16e and ETSI's second generation standards for digital video broadcasting (DVB). The IRA codes control their degree-2 variable nodes in a distinctive way to ensure a linear coding complexity, a low error floor as well as the stability of iterative decoding.

On the other hand, coding theorists and practitioners have recognized that a well-designed LDPC code can achieve capacity-approaching performance universally across a range of data transmission and storage channels. One example is ETSI's second generation DVB standards, which reuse the same LDPC codes for satellite, terrestrial and cable communication. Although this is not an optimal way to achieve capacity like the multi-level codes and the single channel code tailored to a given modulation format, it preserves the compatibility of CODEC structure and avoids the prohibiting complexity of implementation. The DVB LDPC codes family (with two block length 16200 and 64800; code rates coverage from 1/4 to 9/10) was originally developed for satellite communications (DVB-S2), which targeted modulations including BPSK, QPSK, 8PSK, 16APSK and 32APSK. These LDPC codes belong to the class of structured irregular repeat accumulate (S-IRA) codes. As demonstrated by prior methods, the structural simplicity can be admitted to the code ensemble to facilitate a linear complexity for encoding and decoding, without compromising the performance in both waterfall and error floor regions. In particular, under non-iterative modulation and conventional sum-product decoding, the DVB-S2 codes have been shown to be only 0.7-0.8 dB away from Shannon capacity limit at a bit error rate of $10^{-6}$. As a consequence, they have been adopted by standardization bodies for terrestrial and cable communications, and will be reused over terrestrial and cable channels. Nevertheless, the spectral efficiency of each channel type is distinct and needs to be considered in the joint design for coding and modulation. For example, DVB-T2 supports QAM order as high as 256, and DVB-C2 will make 4096-QAM mandatory to meet the demand for higher data rates. In order to preserve the low complexity of channel CODEC and achieve a power-efficient constellation mapping, a random bit interleaver can be plugged between the channel encoder and the constellation mapper to match the irregular profile of a given code to the non-uniform error resilience of a multi-level modulation. This paradigm is generally known as bit-interleaved coded modulation (BICM). Although the insertion of a random bit interleaver typically yields good performance, it is problematic for high-speed implementation for coding and modulation due to the substantial amount of memory and circuits routing involved.

Some work has previously been done in studying the framework of code design for a volume holographic memory (VHM) system with non-uniform error correction requirements. Actually, the model of non-uniform parallel channels can be extended to other applications, such as multi-level modulation, OFDM systems and punctured codes. Moreover, both theoretical analysis and simulation results have demonstrated that the decoding threshold does not depend appreciably on the channel details, but on the mutual information between the input and the output of the effective channel.

SUMMARY OF THE INVENTION

The principles described herein propose modelling the non-uniform parallel channels by a set of surrogate binary erasure channels (BEC), and the approximation is based on the equivalence of bit level capacities. To mitigate the complexity of random bit interleaving, the principles described herein propose constructing a bit demultiplexer and plugging it between the channel encoder and the modulator. The demultiplexer partitions the coded bits uniformly and then maps them to different levels of the constellation mapper. A set of surrogate binary erasure channels (BEC) are used to model the non-uniform parallel channels of a constellation map, where the approximation is based on the equivalence of bit level capacities. It is also an object of the present invention to propose constructing a bit demultiplexer and implementing it between the channel encoder and the modulator. The demultiplexer partitions the coded bits uniformly and then maps them to different levels of the constellation mapper.

DETAILED DESCRIPTION OF THE INVENTION

Multi-level modulation is used in transmission standards, such as DVB-C2, DVB-S2, and DVB-T2. Typically random bit interleavers are used in such applications but are costly in terms of memory and circuitry. The LDPC encoded bits should be mapped to a modulator as optimally as possible, however. In order to reduce the amount of memory and circuitry typically needed for a random interleaver in a multi-level modulation environment, this description pertains to the design of demultiplexers for LDPC coded bitstreams that are used between an LDPC encoder and a constellation mapper. Specifically, this description investigates the design of demultiplexers for a given S-IRA code over non-uniform parallel channels, with a focus on multi-level modulation. Such demultiplexers systematically group the coded bits into parallel groups to feed a constellation mapper. Due to the structural constraint for both codes and demultiplexers, we can apply the multi-edge type (MET) setting proposed by prior methods to incorporate the differences in both received distributions (channel qualities) and edge types.

The principles described herein describe modelling the non-uniform parallel channels of a constellation map by a set of surrogate binary erasure channels (BEG), where the approximation is based on the equivalence of bit level capacities. It is also an object of the present invention to propose constructing a bit demultiplexer and implementing it between the channel encoder and the modulator. The demultiplexer partitions the coded bits uniformly and then maps them to different levels of the constellation mapper.

This description is organized as follows. Section 2 introduces the system model for bit-multiplexed multi-level modulation. Using BEC as a surrogate channel for density evolution, section 3 studies the design of bit demultiplexers under the framework of MET code ensemble. Section 5 presents the numerical results. Finally, Section 6 concludes this description.

Figure 1:
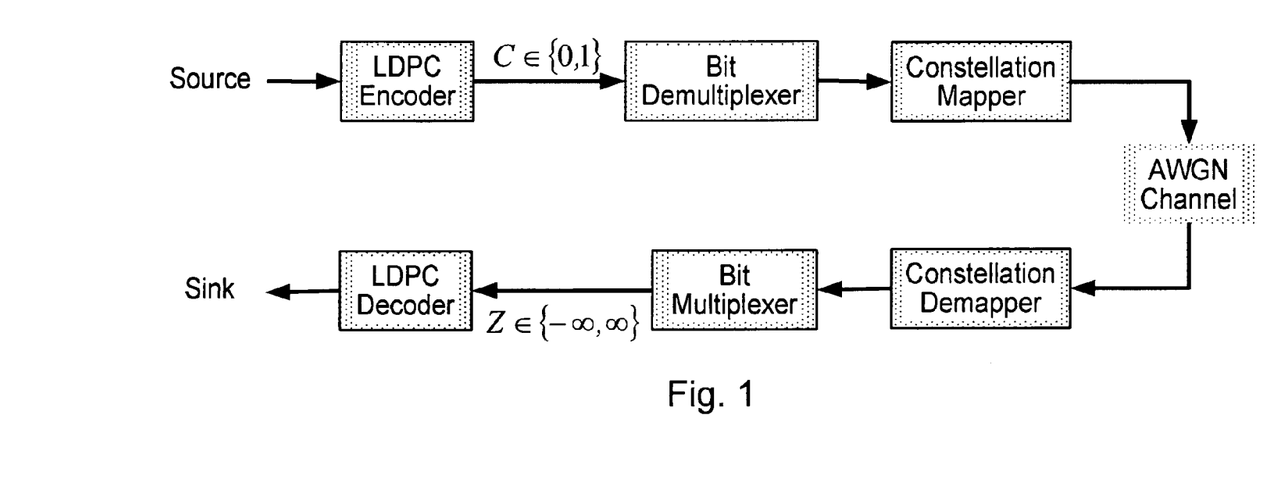
FIG. 1 shows the system model for LDPC coded multi-level modulation with bit demulplexing.
Figure 2:
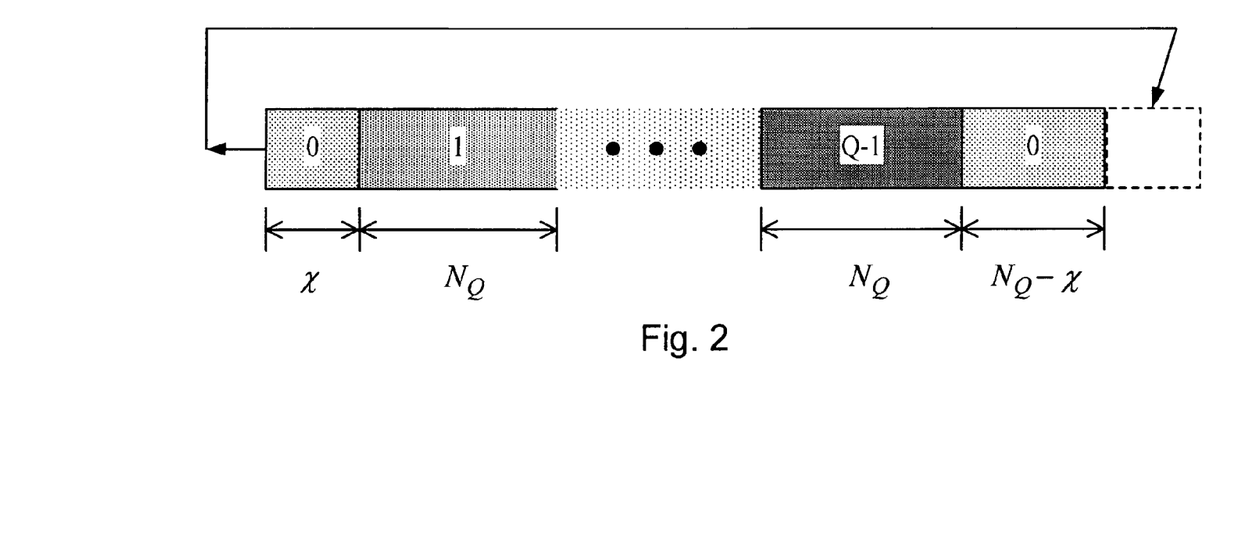
FIG. 2 shows the inner structure of demultiplexer for a length N LDPC code and Q modulation levels.

The system model for the proposed bit-demultiplexed coded modulation is shown in FIG. 1. We assume there is no iteration between the demodulator and the decoder. Without loss of generality, we assume the multi-level modulation takes the form of order $2^Q$ QAM. Suppose the LDPC code has block length N (N is dividable by Q), and the coded bits are sequentially indexed by 0, 1, . . . N−1. The bit demultiplexer D can be defined by an offset $\chi$ and a size-Q set $G=\{g_q\}_{q=1}^Q$, as shown in FIG. 2, where $$\chi \in \left\{0, 1, 2, \ldots \frac{N}{Q} - 1\right\},$$

and the elements in G are a permutation of $\{0, 1, \ldots Q-1\}$. Given $D=\{\chi, G\}$, the bits indices are uniformly partitioned into Q subgroups $\{G_q\}_{q=1}^Q$, where $G_q=\{\chi+g_qN_Q, \ldots, \chi+(g_q+1)N_Q-1\}_{mod\,N}$ and $N_Q=N/Q$. To obtain the l-th QAM symbol $s_l$, the l-th bit in each subgroup are collected together into an array $\{\chi+g_1N_Q+l, \chi+g_2N_Q+l \ldots \chi+g_QN_Q+l\}$ and are fed in parallel to the Q levels of the constellation mapper, where the bits subgroup indexed by $g_q$ is mapped to the constellation level $g_q$. At the output of the AWGN channel, the l-th received symbol is given by $$y_l = s_l + \overline{\omega}_l \quad (1)$$

where $\overline{\omega}_l$ denotes a sample of circularly-symmetric, complex Gaussian noise with double-sided spectral density $N_0/2$, the average symbol energy for $s_l$ is $E_s$.

To extend the application of the concentration theorem to the parallel sub-channels induced by multi-level modulations, an augmented channel model has been used in prior methods, such as J. Hou, P. H. Siegel, L. B. Milstein, and D. Pfister, "Capacity approaching bandwidth-efficient coded modulation schemes based on low-density parity-check codes," *IEEE Trans. Inf. Theory*, pp. 1016-1020, 2003, in which an I.I.D bit generator is imposed on the generic BICM system model to enforce channel symmetry. Consequently, it is used to track the density evolution of an all-zero codeword by predicting the performance of the entire codebook. As a result, when the random input to the demultiplexer has uniform distribution over $\{0,1\}$, the augmented channel between the demultiplexer input (C) and the multiplexer output (Z) satisfies the symmetry condition of $$P(Z=z|C=0)=P(Z=-z|C=1) \quad (2)$$

Figure 3:
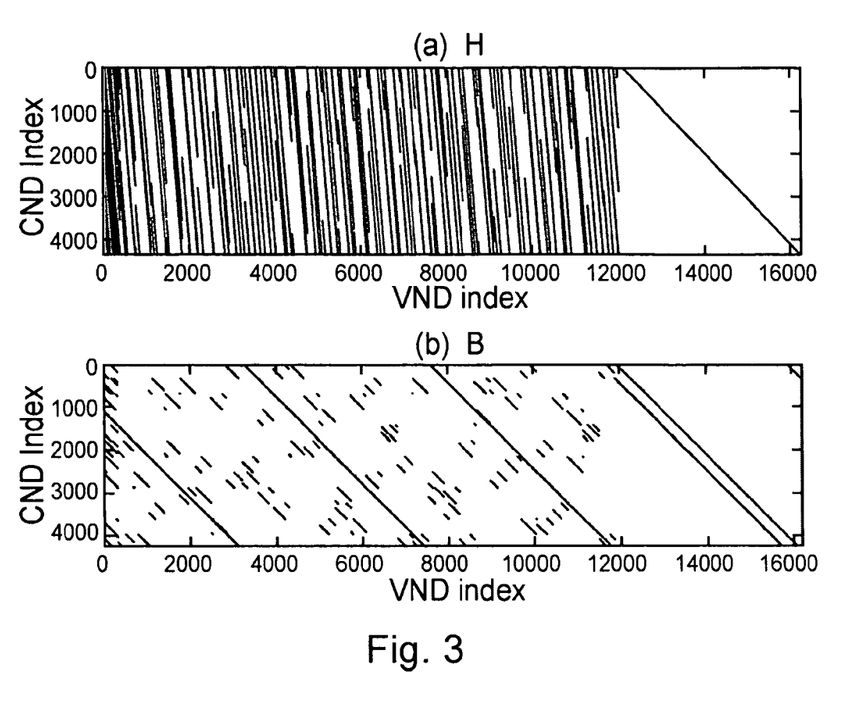
FIG. 3 shows the parity check for structured IRA code: (a) Original parity check H (b) Re-organized parity check B with block-wise cyclic pattern

As seen from the construction of an S-IRA code, its parity check matrix H (size $L\theta \times J\theta$) can always be re-organized into an array $B=[b_{l,j}]$ after applying tailing biting to the ending parity bit. For example, FIG. 3 shows the patterns of the parity check matrix before and after the re-organization for DVB-S2 code of length 16200 and rate 3/4.

Let us assume $I_\theta$ is a size $\theta$ identity matrix, then each entry of this L×J array is a $\theta \times \theta$ matrix, which can be expressed in the form of linear superposition of $I_\theta$ and its cyclic permutations as $$b_{l,j} = \sum_{\tau=0}^{\theta-1} \alpha_\tau(l,j)(\Pi_\theta)^\tau, \quad (3)$$

where $\alpha_\tau(l,j) \in \{0,1\}$, $\Pi_\theta$ is obtained by cyclically shifting all the entries of $I_\theta$ to the left once, the size-$\tau$ ($1<\tau<\theta$) cyclic shift for $I_\theta$ can be represented via $(\Pi_\theta)^\tau$, a $\tau$-fold self multiplication of $I_\theta$ and $(\Pi_\theta)^0=I_\theta$. As a result, the distribution of column weights and the row weights of B can be described by two vectors $W_v=[w_v(1) \ldots w_v(J)]$ and $W_c=[w_c(1) \ldots w_c(L)]$, respectively, where $$w_v(j) = \sum_{\tau=0}^{\theta-1} \sum_{l=1}^{L} \alpha_\tau(l,j) \quad (4)$$

$$w_c(l) = \sum_{\tau=0}^{\theta-1} \sum_{j=1}^{J} \alpha_\tau(l,j). \quad (5)$$

The multi-edge type generalization for irregular LDPC codes unifies coding and modulation by an efficient and compact language. By adding a term associated with "received distribution" to the multinomial expression for a variable node (VND), the channel effects can be incorporated seamlessly into the framework for code and demultiplexer structure optimization. In this description, we focus on investigating the latter aspect.

According to the definition of "edge degree" in prior work done by T. Richardson and R. Urbanke, "Multi-edge type ldpc codes," Pre-prints, Revised April 2006, Accepted to *IEEE Trans. Inform. Theory*., for a uniform channel distribution, there are two distinct edge types for an IRA ensemble, namely: the edges connecting information bit nodes to parity check nodes (CND) and the edges connecting parity bit nodes to parity check nodes. When multi-level modulation is employed, the classification of edge types becomes more involved on the VND side. However, we can exploit the structural features of S-IRA code to simplify the generic degree description for MET codes, yielding $$v(R, X) = \sum_{q=1}^{Q} r_q \sum_{j=1}^{J-L} v_D(q, j) x_1^{W_v(j)} + \quad (6)$$

$$\sum_{q=1}^{Q} r_q \sum_{j=J-L+1}^{J} v_D(q, j) x_2^2 \quad (7)$$

and $$\mu(X) = \sum_{l=1}^{L} u(l) x_2^2 x_1^{W_c(l)-2}, \quad (8)$$

where $X=[x_1\ x_2]$, $R=[r_1, r_2 \ldots r_q]$, $x_1$ and $x_2$ denote the two edge types that emanate from information bit nodes and parity bit nodes, respectively, $r_q$ is the q-th modulation level, $\{v_D(q,j)\}$ and $\{u(l)\}$ are two series of non-negative coefficients that represent the proportion of VND socket type (q, j) and CND socket type l, respectively, and the subscript D designates the dependence on demultiplexer, which leads to the allocation of VNDs to different modulation levels. In particular, we have $$\sum_{q=1}^{Q} \sum_{j=1}^{J} v_D(q, j) = 1, \quad (9)$$

$$\sum_{l=1}^{L} u(l) = \frac{L}{J}. \quad (10)$$

Figure 4:
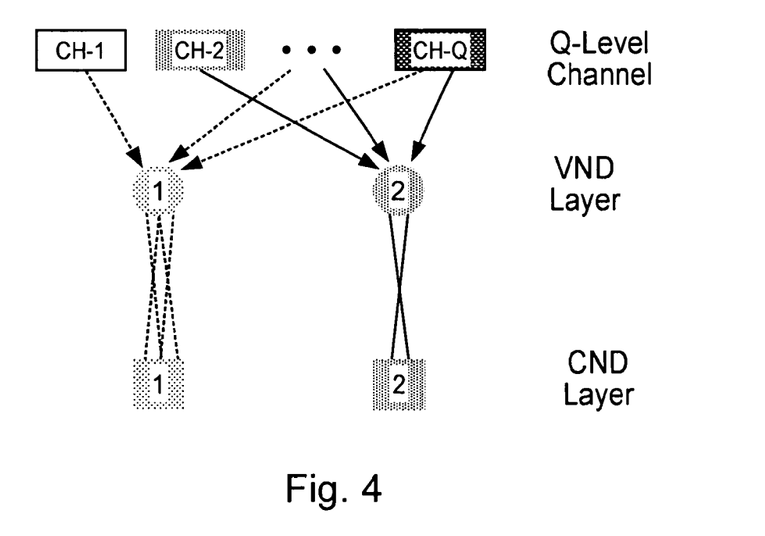
FIG. 4 shows a layered edge degree distribution for S-IRA coded modulation under MET setting.

To illustrate, FIG. 4 shows the edge degree distribution for the module of S-IRA coded modulation across three layers, namely, channel, VND and CND. All the edges incident to VND can be classified into 2Q categories, depending on both the code and the demultiplexer structure. However, the edges incident to CND have two types only, which are predetermined by the code structure and is independent of the demultiplexer design.

To simplify the ensuing statements, we define the partial derivatives of (7) and (8) as follows:

$$\dot{v}_{r_l}(R, X) = \frac{\partial v(R, X)}{\partial r_l}, l = 1, \ldots, Q \quad (11)$$

$$\dot{v}_{x_i}(R, X) = \frac{\partial v(R, X)}{\partial x_i}, i = 1, 2 \quad (12)$$

$$\dot{\mu}_{x_i}(X) = \frac{\partial \mu(X)}{\partial x_i}, i = 1, 2 \quad (13)$$

Considering the conservation law for "typed" sockets in prior approaches, the coefficients of (7) and (8) should satisfy the constraints:

$$\dot{v}_{x_i}(\underline{1}, \underline{1}) = \dot{\mu}_{x_i}(\underline{1}), i = 1, 2 \quad (14)$$

$$\dot{v}_{r_l}(\underline{1}, \underline{1}) = \frac{1}{Q}, l = 1, \ldots, Q. \quad (15)$$

where $\underline{1}=[1, \ldots, 1]$.

Figure 5:
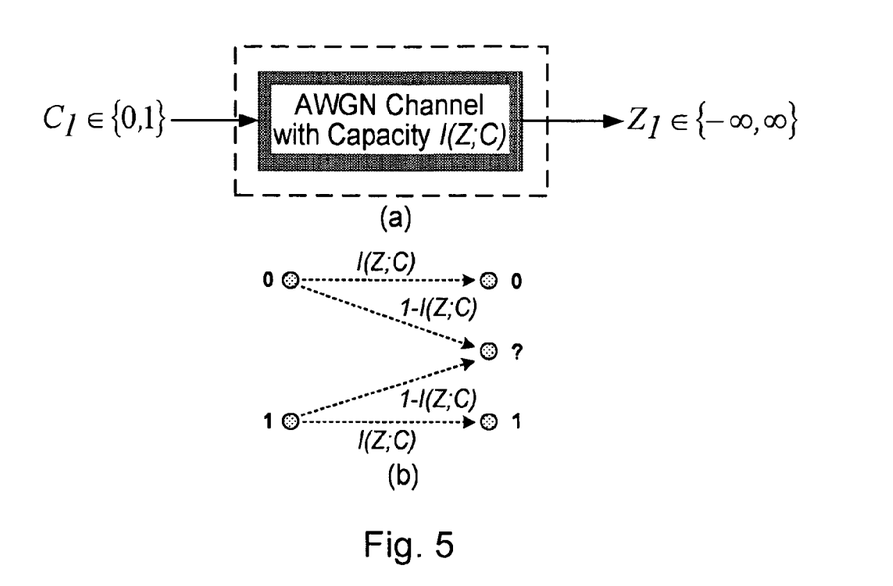
FIG. 5 shows two binary-input channels with equivalent capacity: (a) AWGN channel with capacity I(Z;C) (b) BEC with Erasure Probability 1−I(Z;C)

To make the design of the demultiplexer easily controllable, we can substitute the Q-level constellation mapper by Q parallel binary erasure channels (BEC) with erasure probabilities $\{\epsilon_q^0\}_{q=1}^Q$, and the substitution is based on the equivalence of channel capacity, i.e.

$$I(Z_q;C_q)=1-\epsilon_q^0, q=1,2,\ldots Q \quad (16)$$

where $\epsilon_1^0 < \epsilon_2^0 \ldots < \epsilon_Q^0$, the term on the left-hand-side denotes the bitwise capacity of modulation level q, and the right-hand-side is the capacity of the BEC subchannel q. To illustrate, FIG. 5-(a) depicts an AWGN channel with binary input C and continuous output Z; FIG. 5-(b) shows the BEC surrogate channel for (a) with erasure probability 1−I(Z;C). This substitution is based on some empirical evidence, as well as the observations made by prior methods (C. Jones, A. Matache, T. Tian, J. Cillasenor, and R. Wesel, "The universality of ldpc codes on wireless channels," *IEEE Milcom Conf.*, 2003. and M. Franceschini, G. Ferrari, and R. Raheli, "Does the performance of LDPC codes depend on the channel?" *IEEE Trans. on Commun.*, pp. 2129-2132, 2006.), as the decoding threshold of a given LDPC code ensemble mainly depends on the mutual information between the encoder output and the decoder input of the effective channel, rather than the channel details. Based on the use of surrogate BEC, the investigation of the decoding behavior can be greatly simplified, since the task of tracking the decoding trajectory reduces to observing the evolution of erasure probability on each subchannel, and the prohibiting complexity incurred by "infinite dimensional algebra" of a generic density evolution algorithm is circumvented. In fact, the substitution in (16) is not limited to a constellation mapper, and it can be generalized to a number of memoryless parallel channels.

During the course of message passing decoding for LDPC codes, the set of VNDs and CNDs exchange information along the edges that connect them. In one iteration, the sets of VNDs and CNDs are activated alternatively. Each active node, either a VND or a CND, accepts from its incident edges the input messages, computes its outputs, which are updates of the inputs, and then restitutes them to the edges. In our case, depending on the type of edges, all the circulating messages can be classified into two categories. To obtain the distribution for different types of messages, we normalize (12) and (13) by (14), yielding $$\Lambda(R,X)=[\lambda_1(R,X)\lambda_2(R,X)] \quad (17)$$

$$(\Phi)(X)=[\rho_1(X)\rho_2(X)] \quad (18)$$

where $$\lambda_n(R, X) = \frac{\dot{v}_{x_n}(R, X)}{\dot{v}_{x_n}(1, 1)} \text{ and } \rho_n(X) = \frac{\dot{\mu}_{x_n}(X)}{\dot{\mu}_{x_n}(1)}, n = 1, 2.$$

At the beginning of message passing decoding, we initialize the received distribution R by the Q erasure probabilities of BEC channel, yielding:

$$R_\epsilon=[\epsilon_1^0, \ldots, \epsilon_Q^0] \quad (19)$$

Substituting (19) into (18), we have the erasure probabilities at the VND output for the first iteration $$\Omega_l=\Lambda(R_\epsilon,1) \quad (20)$$

To obtain the erasure probabilities at the CND output, we can replace X by $1-\Omega_l$, yielding $$\Delta_l=1-\Phi(1-\Omega_l) \quad (21)$$

As a consequence, the evolution of erasure probabilities can be represented recursively as $$\Omega_k=\Lambda(R_\epsilon,\Delta_{k-l})=\Lambda(R_\epsilon,1-\Phi(1-\Omega_{k-l})), k>1 \quad (22)$$

For the system modeled by FIG. 4, the VND degree distributions in (7), (12) and (17) are determined by the configuration of the demultiplexer when the channel code and the constellation mapper are fixed. To emphasize the dependence on D, we rewrite (22) as $$\Omega_k(D) = \Lambda_D(R_e, 1 - \Phi(1 - \Omega_{k-1})), k > 1 \qquad (23)$$

which emphasizes the decoding behavior is a function of the demultiplexer D.

Assuming the number of decoding iterations is upper bounded by T and the target error probability is $\epsilon$, then the optimization for D can be obtained by solving the following problem:

$$\min_D \gamma(D) \qquad (24)$$

$$\text{subject to } \max(\Omega_T(D)) \leq \varepsilon \qquad (25)$$

$$\sum_{q=1}^{Q} \sum_{j=1}^{J} v_D(q, j) = 1 \qquad (26)$$

$$\sum_{l=1}^{L} u(l) = \frac{L}{J} \qquad (27)$$

$$\hat{v}_{x_i}(1, 1) = \hat{\mu}_{x_i}(1), i = 1, 2 \qquad (28)$$

$$\hat{v}_{r_l}(1, 1) = \frac{1}{Q}, l = 1, \ldots, Q \qquad (29)$$

where $\gamma = E_s/N_0$ is the average SNR of the transmitted signal.

For binary modulations, the error floor performance of a given S-IRA code under message passing decoding is determined by the edge permutations between the CND layer and the VND layer, as shown by FIG. 4. Nevertheless, for multilevel modulations, the edge interleaving between the channel layer and the VND layer also contributes to the error floor since the initial message input to the decoding algorithm is calculated by symbol-wise marginalization. In high SNR cases, it is the bit levels with least error protection in the constellation mapper that will suffer most from a corrupted symbol. For instance, if more than one of the edges connected to a CND are erased and the messages being carried on these edges are obtained via demapping of the same constellation symbol, the decoder will get trapped and the symbol error will never be corrected regardless of the number of decoding iterations. We call such a phenomenon as "CND collision" for simplicity, which is a major contributing factor to the error floor, especially in the presence of deep channel fading. Actually, given the number of modulation levels Q, we can prove the following Lemma. Due to the space limitation, the details of the proof are not included in this description.

Lemma: For a given code, the amount of CND collisions incurred by any choice of demultiplexer $D = \{\chi, G\}$ among all modulation levels is independent of the cyclic shift $\chi$ and the permutation G when the modulation level Q is fixed a priori.

Actually, it is not necessary to consider the CND collision among bit levels with smallest erasure probability $\epsilon_q^0$, since they are unlikely to have an error. The goal of improving the error floor can be accomplished by lessening the effect of CND collisions among the most error prone bit levels. Without violating the structural constraint of D, we can choose to offset the de-multiplexed bits within $G_q$, $q = 1, \ldots Q$ such that mapping of those error prone bits to the same CND is avoided. Theoretically, we can add "reducing CND collision" as an extra constraint to (24), but the solution may compromise the performance in the waterfall region. On the other hand, most practical systems employ a concatenated channel coding scheme, in which an outer code (e.g. BCH, RS) with mild error correction capabilities is placed in front of a more powerful inner code. Thereby, we can solve (24)-(29) first to find $D^* = \{\chi^*, G^*\}$. Then, we can seek to minimize the number of CND collisions among the w weakest bit levels corresponding to demultiplexer indices $\{g_q^*\}_{q=1}^w$, which satisfies $\epsilon_{g_q^*}^0 > \epsilon_{g_p^*}^0$, $1 \leq q \leq w$, $w < p \leq Q$. For convenience, we still consider the re-organized parity check matrix B. Assume the w demultiplexed bit stream are indexed sequentially by $\Psi_q = [\chi^* + g_q^* N_Q \cdots \chi^* + (g_q^* + 1) N_Q - 1]_{mod N}$, $1 \leq q \leq w$, then we can find the set of offsets $\Xi^* = \{O_q\}_{q=1}^{w-1}$ by solving $$\Xi^* = \min_{\Xi} \left( B_{\Psi_w} + \sum_{q=1}^{w-1} B_{(\Psi_q + O_q)_{mod\ N}} \right), \qquad (30)$$

where the sum inside the bracket denotes the number of CND collisions among the w weakest bit levels for the $N_Q$ constellation symbols corresponding to an entire code block. Finally, the full demultiplexer configuration can be obtained by combining the solutions for both (24)-(29) and (30), yielding $D_f^* = \{D^*, \Xi^*\}$.

To test the efficacy of the proposed design methodology, we employ the short block length (N=16200) LDPC code specified in the DVB-S2/T2 standards as the channel code and consider the square 1024-QAM and 4096-QAM modulations, which are proposed to be deployed in the next generation of DVB cable channels. By making use of the structural regularity of the DVB-S2 codes, prior methods have proposed a bit interleaving strategy that can avoid the occurrence of CND collisions among all modulation levels. However, we recognize that the occurrence of CND collision is not necessarily bad, especially when a high-degree VND is connected to a low-degree VND via a common CND. Heuristically, this is because the high-degree VND usually carries Log-Likelihood Ratio (LLR) messages of higher reliability, which can help the low-degree VND to achieve a fast decoding convergence. Therefore, in our design and simulations, we first optimize the demultiplexer configuration by solving (24)-(29), and then consider CND collision avoidance among the weakest bit levels by optimizing (30).

Throughout this section, we consider Monte-Carlo simulation results and use the case of "no-interleaving" (continuous bits grouping and mapping to constellation mapper) as a common benchmark. For each SNR tested for decoding convergence, the simulation trial is terminated when 50 frame errors have been detected. A comparison of decoded BER for information bits are given in FIG. 6 and FIG. 7 for code rate 7/9 and two modulation formats (4096- and 1024-QAM). The configuration of the DVB-T2 style bit interleaving of prior methods can be described by $\chi=0$, $G=\{7,5,9,6,1,3,2,4,10,8\}$, $\Xi=\{0,1,2,2,3,3,4,4,5,7\}$. In contrast, the demultiplexer designed used in the proposed method under the principles described herein is given by $\chi=3240$, $G=\{2,4,8,3,9,7,6,1,10,5\}$, $\Xi=\{0,0,0,0,0,0,0,0,0\}$.

Figure 6:
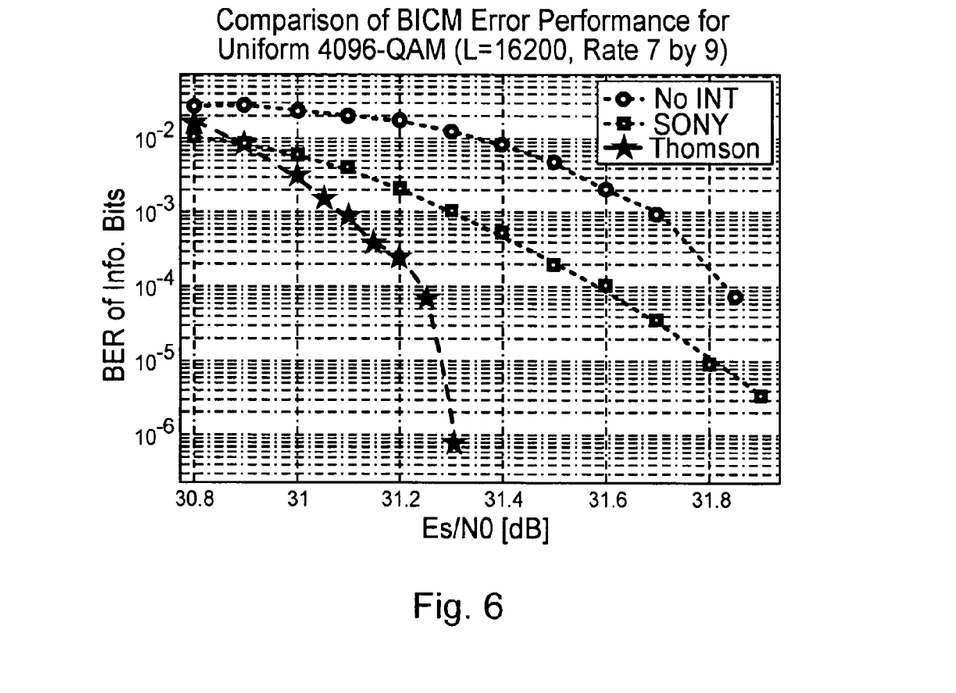
FIG. 6 shows the comparison of error performance for rate 7/9 LDPC coded 4096-QAM using different bit interleavers.
Figure 7:
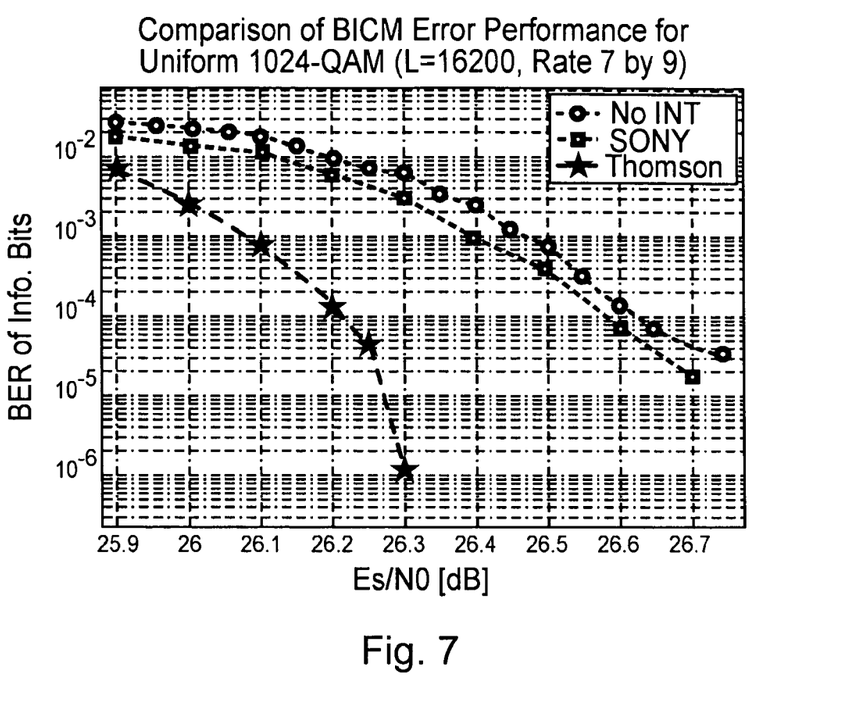
FIG. 7 shows the comparison of error performance for rate 7/9 LDPC coded 1024-QAM using different bit interleavers.

It can be observed from these curves that the bit demultiplexer designed using the proposed approach can achieve significant power savings (gain$\geq$0.4 dB) relative to the DVB-T2 style interleavers. Both methods outperform the scenario of no interleaving, which demonstrates that a dedicated bit interleaver/demultiplexer is necessary to tradeoff between the spectral efficiency and power efficiency when an irregular LDPC code is used for forward error correction over a non-uniform channel.

Figure 8:
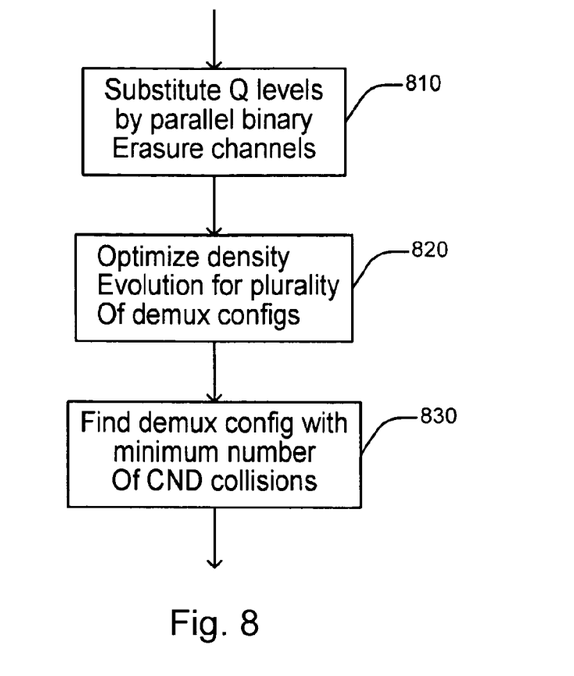
FIG. 8 shows a method for demultiplexing a LDPC coded bitstream for multi-level modulation.

FIG. 8 shows a method 800 for designing a demultiplexer of an LDPC encoded bitstream for multi-level modulation. The Q levels of a constellation mapper for a particular modulation method are substituted by the Q levels of parallel binary erasure channels in step 810. Next, the density evolution of the erasure probabilities for a plurality of demultiplexer configurations is optimized in step 820. Then, in step 830, the demultiplexer configuration with the minimum number of CND collisions is found among those demultiplexer configurations found in step 820.

Figure 9:
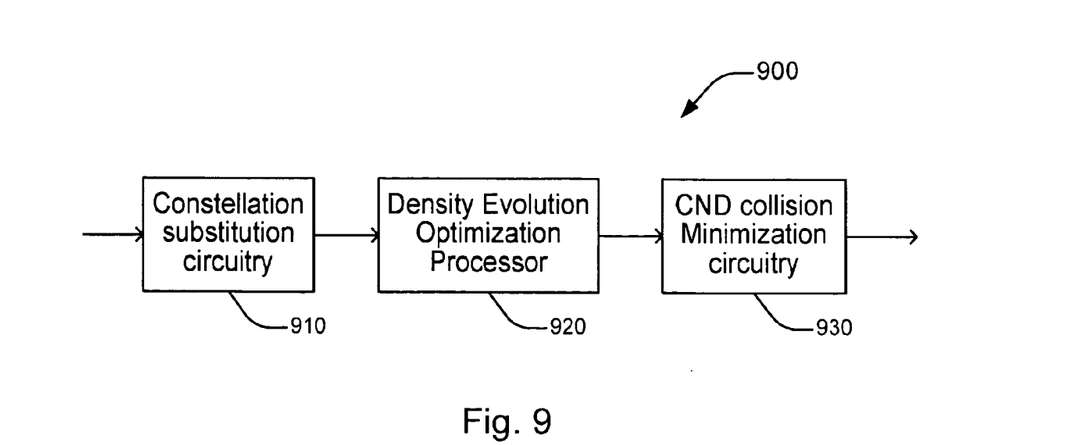
FIG. 9 shows an apparatus for demultiplexing an LDPC coded bitstream for multi-level modulation.

FIG. 9 shows an apparatus for designing a demultiplexer of an LDPC encoded bitstream for multi-level modulation. The Q-level constellation of a particular modulation method is substituted by the Q levels of parallel binary erasure channels by circuitry 910. A processor 920 optimizes the density evolution of the binary erasure channels over a plurality of demultiplexer configurations. Circuitry 930 for determining the configuration with the minimum number of CND collisions is then used to generate a demultiplexer configuration.

The configuration can also be used for the multiplexer used at the receiver.

In this description, we have discussed the design of a bit demultiplexer for multilevel modulations, assuming the channel code is given and belongs to the class of S-IRA code. Based on the framework of multiedge type LDPC codes introduced by Richardson and Urbanke, and using the BEC as a surrogate channel, we formulated the design of the bit demultiplexer as a solution to a constrained optimization problem. The decoding performance in both the waterfall region and the error floor region have been addressed. Using the LDPC codes standardized in the DVB-S2/T2 specification as our prototype, this description shows that the proposed bit demultiplexer achieves a good tradeoff between power and spectral efficiency, and outperforms the interleaving strategy adopted by the DVB-T2 standard.

We thus provide one or more implementations having particular features and aspects. However, features and aspects of described implementations may also be adapted for other implementations. Although implementations described herein may be described in a particular context, such descriptions should in no way be taken as limiting the features and concepts to such implementations or contexts.

It will thus be appreciated that those skilled in the art will be able to devise various arrangements that, although not explicitly described or shown herein, embody the present principles and are included within its spirit and scope. The present principles are equally applicable to header information of different lengths with appropriate modification of the methods and apparatus of the present invention.

The implementations described herein may be implemented in, for example, a method or process, an apparatus, or a software program. Even if only discussed in the context of a single form of implementation (for example, discussed only as a method), the implementation or features discussed may also be implemented in other forms (for example, an apparatus or program). An apparatus may be implemented in, for example, appropriate hardware, software, and firmware. The methods may be implemented in, for example, an apparatus such as, for example, a computer or other processing device. Additionally, the methods may be implemented by instructions being performed by a processing device or other apparatus, and such instructions may be stored on a computer readable medium such as, for example, a CD, or other computer readable storage device, or an integrated circuit. Further, a computer readable medium may store the data values produced by an implementation.

As should be evident to one of skill in the art, implementations may also produce a signal formatted to carry information that may be, for example, stored or transmitted. The information may include, for example, instructions for performing a method, or data produced by one of the described implementations.

Additionally, many implementations may be implemented in one or more of an encoder, a pre-processor to an encoder, a decoder, or a post-processor to a decoder. The implementations described or contemplated may be used in a variety of different applications and products. Some examples of applications or products include set-top boxes, cell phones, personal digital assistants (PDAs), televisions, personal recording devices (for example, PVRs, computers running recording software, VHS recording devices), camcorders, streaming of data over the Internet or other communication links, and video-on-demand.

Further, other implementations are contemplated by this specification. For example, additional implementations may be created by combining, deleting, modifying, or supplementing various features of the disclosed implementations.

All examples and conditional language recited herein are intended for pedagogical purposes to aid the reader in understanding the present principles and the concepts contributed by the inventor(s) to furthering the art, and are to be construed as being without limitation to such specifically recited examples and conditions. Other hardware, conventional and/or custom, may also be included. Similarly, any switches shown in the figures are conceptual only. Their function may be carried out through the operation of program logic, through dedicated logic, through the interaction of program control and dedicated logic, or even manually, the particular technique being selectable by the implementer as more specifically understood from the context.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

The invention claimed is:

1. A method of demultiplexing a Low Density Parity Check (LDPC) coded bitstream, comprising:
   receiving a LDPC coded bitstream; and
   demultiplexing the received LDPC coded bitstream using an optimized demultiplexer, the optimized demultiplexer configured to:
      substitute Q-levels of a constellation mapper by Q parallel binary erasure channels;
      optimizing a density evolution over said binary erasure channels for a plurality of demultiplexer configurations to produce corresponding plurality of optimized demultiplexer configurations; and
      identifying from the plurality of optimized demultiplexer configurations those configurations with a minimum number of check node decoder collisions.

2. The method of claim 1, further comprising providing the output of said demultiplexer as an input to a constellation mapper.

3. The method of claim 2, wherein said method is used for a DVB-T2 environment.

4. The method of claim 2, wherein said method is used for cable transmission.

5. The method of claim 2, wherein said method is used in a terrestrial broadcast environment.

6. An apparatus for demultiplexing a Low Density Parity Check coded bitstream for multi-level modulation by receiving a Low Density Parity Check coded bitstream; and demultiplexing using an optimized demultiplexer, said optimization circuitry comprising:
- circuitry for substituting Q-levels of a constellation mapper by Q parallel binary erasure channels;
- processor for optimizing a density evolution over said binary erasure channels for a plurality of demultiplexer configurations to produce corresponding plurality of optimized demultiplexer configurations; and
- circuitry for identifying from the plurality of optimized demultiplexer configurations a demultiplexer configuration with a minimum number of check node decoder collisions.

7. The apparatus of claim 6, wherein said demultiplexer output is provided to a constellation mapper.

8. The apparatus of claim 7, wherein said apparatus is used in a DVB-T2 environment.

9. The apparatus of claim 7, wherein said apparatus is used for cable transmission.

10. The apparatus of claim 7, wherein said apparatus is used in a terrestrial broadcast environment.

* * * * *